United States Patent
Pribyl

(10) Patent No.: US 7,100,532 B2
(45) Date of Patent: Sep. 5, 2006

(54) PLASMA PRODUCTION DEVICE AND METHOD AND RF DRIVER CIRCUIT WITH ADJUSTABLE DUTY CYCLE

(75) Inventor: Patrick Pribyl, South Pasadena, CA (US)

(73) Assignee: Plasma Control Systems, LLC, South Pasadena, CA (US)

( * ) Notice: Subject to any disclaimer, the term of this patent is extended or adjusted under 35 U.S.C. 154(b) by 14 days.

(21) Appl. No.: 10/874,096

(22) Filed: Jun. 21, 2004

(65) Prior Publication Data

US 2004/0263412 A1 Dec. 30, 2004

Related U.S. Application Data

(63) Continuation-in-part of application No. 10/419,052, filed on Apr. 17, 2003, which is a continuation-in-part of application No. 10/268,053, filed on Oct. 9, 2002.

(60) Provisional application No. 60/480,338, filed on Jun. 19, 2003, provisional application No. 60/328,249, filed on Oct. 9, 2001.

(51) Int. Cl.
*C23C 16/00* (2006.01)
*C23F 1/02* (2006.01)

(52) U.S. Cl. ............... 118/723 I; 118/723 AN; 118/723 R; 156/345.48; 156/345.39; 343/866; 343/742; 343/867; 315/111.51

(58) Field of Classification Search ............... None
See application file for complete search history.

(56) References Cited

U.S. PATENT DOCUMENTS

| | | |
|---|---|---|
| 3,860,507 A | 1/1975 | Vossen, Jr. |
| 4,557,819 A | 12/1985 | Meacham et al. |
| 4,629,887 A | 12/1986 | Bernier |
| 4,792,732 A | 12/1988 | O'Loughlin |
| 4,824,546 A | 4/1989 | Ohmi |
| 5,108,569 A | 4/1992 | Gilboa et al. |
| 5,140,223 A | 8/1992 | Gesche et al. |
| 5,147,493 A | 9/1992 | Nichimura et al. |
| 5,273,610 A | 12/1993 | Thomas, III et al. |
| 5,288,971 A | 2/1994 | Knipp |
| 5,429,070 A | 7/1995 | Campbell et al. |

(Continued)

FOREIGN PATENT DOCUMENTS

WO    WO 01/93315 A2    12/2001

(Continued)

OTHER PUBLICATIONS

Batchelor, D.B., *Overview of ORNL RF Theory*, May 9, 2000, presented in ornl dbb Jun. 19, 2001.

(Continued)

*Primary Examiner*—Tuyet Thi Vo
(74) *Attorney, Agent, or Firm*—Jones Day

(57) ABSTRACT

A reactive circuit is disclosed as part of a method and system for generating high density plasma that does not require the use of a dynamic matching network for directly driving a plasma exhibiting a dynamic impedance. The reactive network is designed to provide a small total reactance when the plasma reactance is at a first plasma reactance and presents a reactance that does not exceed a specified limit at a second plasma reactance. The first and second plasma reactance span a substantially fraction of an expected dynamic plasma reactance range. The first and second plasma reactance values may, for example, correspond to a high expected plasma reactance limit and a low expected plasma reactance limit respectively or the first plasma reactance may correspond to an average expected plasma reactance.

33 Claims, 14 Drawing Sheets

U.S. PATENT DOCUMENTS

| | | | |
|---|---|---|---|
| 5,473,291 | A | 12/1995 | Brounley |
| 5,478,429 | A | 12/1995 | Komino et al. |
| 5,541,482 | A | 7/1996 | Siao |
| 5,558,718 | A | 9/1996 | Leung |
| 5,580,385 | A | 12/1996 | Paranjpe et al. |
| 5,602,865 | A | 2/1997 | Laakmann |
| 5,609,690 | A | 3/1997 | Watanabe et al. |
| 5,643,364 | A | 7/1997 | Zhao et al. |
| 5,654,679 | A | 8/1997 | Mavretic et al. |
| 5,688,357 | A | 11/1997 | Hanawa |
| 5,689,949 | A | 11/1997 | DeFreitas et al. |
| 5,712,592 | A | 1/1998 | Stimson et al. |
| 5,734,353 | A | 3/1998 | Van Voorhies |
| 5,747,935 | A | 5/1998 | Porter et al. |
| 5,815,047 | A | 9/1998 | Sorensen et al. |
| 5,892,198 | A | 4/1999 | Barnes et al. |
| 6,007,879 | A | 12/1999 | Scholl |
| 6,150,628 | A | 11/2000 | Smith et al. |
| 6,165,311 | A | 12/2000 | Collins et al. |
| 6,252,354 | B1 | 6/2001 | Collins et al. |
| 6,264,812 | B1 | 7/2001 | Raaijmakers et al. |
| 6,304,036 | B1 | 10/2001 | Freeman et al. |
| 6,305,316 | B1 | 10/2001 | DiVergilio et al. |
| 6,326,584 | B1 | 12/2001 | Jewett et al. |
| 6,388,226 | B1 | 5/2002 | Smith et al. |
| 6,392,210 | B1 | 5/2002 | Jewett et al. |
| 6,432,260 | B1 | 8/2002 | Mahoney et al. |
| 6,486,431 | B1 | 11/2002 | Smith et al. |
| 6,552,296 | B1 | 4/2003 | Smith et al. |

FOREIGN PATENT DOCUMENTS

| | | |
|---|---|---|
| WO | WO 02/082861 A1 | 10/2002 |
| WO | PCT/US04/12277 | 2/2005 |

OTHER PUBLICATIONS

Hayden et al., *The Application of Helicon Antennas as a Secondary Plasma Source for Ionized PVD*, University of Illinois at Urbana-Champaign.

International Search Report of International Application No. PCT/US02/32334, mailed Feb. 26, 2003.

*Long-Term Evaluation of the Litmas "Blue" Plasma Device for Point-of-Use (POU) Perfluorocompound and Hydrofluorocarbon Abatement*, by International SEMATECH.

Mode Conversion Experiment in CAT, *available at* http://www.physics.auburn.edu/~plasma/fusion/fusion_lab/cat/icrf/construction.html (printed Apr. 19, 2002).

Patil et al., *Microwave plasma deposition of diamond like carbon coatings*, PRAMANA J. Physics, vol. 55, Nos. 5 & 6, Nov. & Dec. 2000, pp. 933-939.

Ritchey, *Tuner Topics*, by Advanced Energy.

3kW and 5kW Half-Bridge Class-D RF Generators at 13.56MHz 89% Efficiency and Limited Frequency Agility, Direct Energy, Inc., 2002.

Litmas RPS 1501, copyright notice dated 2004.

Article entitled "*Improving Processes Through RF Power Control*", published in Semiconductor Fabtech—11th Edition (Feb. 2000).

Article entitled "A 2-MHz 6-k VA Voltage-Source Inverter Using Low-Profile Mosfet Modules for Low-Temperature Plasma Generators," published in IEEE Transactions on Power Electronics, vol. 14, No. 6 (Nov. 1999).

Article entitled "A 2-MHz, 6-k VA Voltage-Source Inverter Using Low-Profile Mosfet Modules for Low-Temperature Plasma Generators," by Hideaki Fujita, Hirofumi Akagi (Dept. of Electrical Engineering) and Shinichi Shinohara (Orgin Electric Co., Ltd.), copyright 1998 IEEE.

Article entitled "A 2-MHz 2-kW Voltage-Source for Low-Temperature Plasma Generators: Implementation of Fast Switching with a Third-Order Resonant Circuit," published in IEEE Transactions on Industry Applications, vol. 35, No. 1 (Jan./Feb. 1999) by Hideaki Fujita and Hirofumi Akagi.

(A)

(B)

PLASMA PRODUCTION DEVICE AND METHOD AND RF DRIVER CIRCUIT WITH ADJUSTABLE DUTY CYCLE

REFERENCE TO RELATED APPLICATIONS

This application claims priority to U.S. Provisional Patent Application No. 60/480,338 filed on Jun. 19, 2003 under 35 U.S.C. §119, and is a continuation-in-part of U.S. patent application Ser. No. 10/419,052 filed on Apr. 17, 2003, which is a continuation-in-part of U.S. patent application Ser. No. 10/268,053 filed on Oct. 9, 2002, which claims the benefit under 35 U.S.C. §119 of priority to U.S. Provisional Patent Application No. 60/328,249 filed on Oct. 9, 2001, all of which are incorporated herein in their entirety by reference.

FIELD OF THE INVENTION

The present invention relates generally to the design and implementation of a plasma generation system. More particularly, it relates to radio frequency amplifiers, antennas and effective circuit connections for interfacing the amplifiers and antennas for generating plasma.

BACKGROUND OF THE INVENTION

Plasma is generally considered to be one of the four states of matter, the others being solid, liquid and gas states. In the plasma state the elementary constituents of a substance are substantially in an ionized form. This form is useful for many applications due to, inter alia, its enhanced reactivity, energy, and suitability for the formation of directed beams.

Plasma generators are routinely used in the manufacture of electronic components, integrated circuits, and medical equipment, and in the operation of a variety of goods and machines. For example, plasma is extensively used (i) to deposit layers of a desired substance, for instance, following a chemical reaction or sputtering from a source, (ii) to etch material with high precision, (iii) to sterilize objects by the free radicals present in the plasma or induced by the plasma, and (iv) to modify surface properties of materials.

Plasma generators based on radio frequency ("RF") power supplies are often used in experimental and industrial settings since they provide a ready plasma source, and are often portable and easy to relocate. Such plasma generators couple RF radiation to a gas, typically at reduced pressure (and density), causing the gas to ionize. In any RF plasma production system, the plasma represents a variable load at the antenna terminals, which are typically driven by the RF power supply, as the process conditions change. Such variable process conditions include, changes in working gas and pressure, which affect the amount of loading seen at the antenna terminals. In addition, the amplitude of the RF drive waveform itself affects the plasma temperature and density, which in turn also affects the antenna loading. Thus, to the RF power source, the antenna/plasma combination is a non-constant and nonlinear load.

A typical RF source has an output impedance of about 50 ohm, and as a result couples most efficiently to a load that presents a matching 50 ohm impedance. Because of the often unpredictable changes in the plasma self inductance, effective resistance, and mutual inductance to the antenna, provision for dynamic impedance matching is made by retuning some circuit elements and possibly the plasma to obtain satisfactory energy transfer from the RF source to the generated plasma. To achieve this, an adjustable impedance matching network, or "matching box" is typically used to compensate for the variation in load impedance due to changes in plasma conditions.

A typical dynamic matching box contains two independent tunable components: one for adjusting the series impedance and another for adjusting the shunt impedance. These tunable components must be adjusted in tandem with each other in order to achieve the optimum power transfer to the plasma. Not surprisingly, accurate tuning of these components is often a difficult process. Typically, retuning requires both manual/mechanical operations/actuators to adjust one or more component values as the plasma impedance changes and generally sophisticated feedback circuitry for the rather limited degree of automation possible.

It is well known that the application of a sufficiently large electric field to a gas separates electrons from the positively charged nuclei within the gas atoms, thus ionizing the gas and forming the electrically conductive fluid-like substance known as plasma. Coupling radio frequency electric and magnetic fields to the gas, via an antenna, induces currents within this ionized gas. This, in turn, causes the gas to further ionize, thereby increasing its electrical conductivity, which then increases the efficiency with which the antenna fields couple to the charged particles within the gas. This leads to a further increase in the induced currents, resulting in the progressive electrical breakdown and substantial ionization of the gas. The effectiveness of the RF coupling is dependent upon the particular RF fields and/or waves that are used. Some RF field configurations and waves that are suitable for the efficient production of large volumes of plasma are described next.

Whistler waves are right-hand-circularly-polarized electromagnetic waves (sometimes referred to as R-waves) that can propagate in an infinite plasma immersed in a static magnetic field $B_o$. If these waves are generated in a finite plasma, such as a cylinder, the existence of boundary conditions—i.e. the fact that the system is not infinite—cause a left-hand-circularly-polarized mode (L-wave) to exist simultaneously, together with an electrostatic contribution to the total wave field. These "bounded Whistler" are known as Helicon waves. See Boswell, R. W., *Plasma Phys.* 26,1147 (1981). Their interesting and useful qualities include: (1) production and sustenance of a relatively high-density plasma with an efficiency greater than that of other RF plasma production techniques, (2) plasma densities of up to $N_p \sim 10^{14}$ particles per cubic centimeter in relatively small devices with only a few kW of RF input power, (3) stable and relatively quiescent plasmas in most cases, (4) high degree of plasma uniformity, and (5) plasma production over a wide pressure range, from a fraction of a mTorr to many tens of mTorr. Significant plasma enhancement associated with helicon mode excitation is observed at relatively low $B_o$-fields, which are easily and economically produced using inexpensive components.

Significant plasma density ($N_p$) enhancement and uniformity may be achieved by excitation of a low-field m=+1 helicon R-wave in a relatively compact chamber with $B_o$<150 G. This may be achieved, for instance, through the use of an antenna whose field pattern resembles, and thus couples to, one or more helicon modes that occupy the same volume as the antenna field. The appropriate set of combined conditions include the applied magnetic field $B_o$, RF frequency ($F_{RF}$), the density $N_p$ itself, and physical dimensions.

Some antenna designs for coupling RF power to a plasma are disclosed by U.S. Pat. Nos. 4,792,732, 6,264,812 and 6,304,036. However, these designs are relatively complex often requiring custom components that increase the cost of system acquisition and maintenance. Moreover, not all of the designs are suitable for efficient generation of the helicon mode, which is a preferred mode disclosed herein.

RF power sources typically receive an external RF signal as input or include an RF signal generating circuit. In many processing applications, this RF signal is at a frequency of about 13.56 MHz although this invention is not limited to operation at this frequency. The RF signal is amplified by a power output stage and then coupled via an antenna to a gas/plasma in a plasma generator for the production of plasma.

Amplifiers, including RF amplifiers suitable for RF power sources, are conventionally divided into various classes based on their performance characteristics such as efficiency, linearity, amplification, impedance, and the like, and intended applications. In power amplification, an important concern is the amount of power wasted as heat, since heat sinks must be provided to dissipate the heat and, in turn, increase the size of devices using an inefficient amplifier. A characteristic of interest is the output impedance presented by an amplifier since it sets inherent limitations on the power wasted by an amplifier.

Typical RF amplifiers are designed to present a standard output impedance of 50 Ohms. Since, the voltage across and current through the output terminals of such an amplifier are both non-zero, their product provides an estimate of the power dissipated by the amplifier.

This product can be reduced by introducing a phase difference between the voltage and the current across the output terminals of the amplifier in analogy with the power dissipated in a switch. In contrast to conventional amplifiers, a switch presents two states: it is either ON, corresponding to a short circuit, i.e., low impedance, or OFF, corresponding to an open circuit, i.e., infinite (or at least a vary large) impedance. In switched mode amplifiers, the amplifier element acts as a switch under the control of the signal to be amplified. By suitably shaping the signals, for instance with a matching load network, it is possible to introduce a phase difference between the current and the voltage such that they are out of phase to minimize the power dissipation in the switch element. In other words, if the current is high, the voltage is low or even zero and vice versa. U.S. Pat. Nos. 3,919,656 and 5,187,580 disclose various voltage/current relationships for reducing or even minimizing the power dissipated in a switched mode amplifier.

U.S. Pat. No. 5,747,935 discloses switched mode RF amplifiers and matching load networks in which the impedance presented at the desired frequency is high while harmonics of the fundamental are short circuited to better stabilize the RF power source in view of plasma impedance variations. These matching networks add to the complexity for operation with a switched mode power supply rather than eliminate the dynamic matching network. Such a matching load network is also not very frequency agile since it depends on strong selection for a narrow frequency band about the fundamental.

U.S. Pat. No. 6,432,260 discloses use of switched elements in matching impedance networks to ensure that the dynamic complex impedance of the plasma is seen as a near resistive value, effectively neutralizing the reactive components of plasma impedance. This allows a power source to only respond to resistive changes in the plasma since it is only such changes that are seen by the power source. The dynamic plasma resistance controls the power delivered to the plasma.

When plasma impedance is a small fraction of the impedance seen by the RF source, variations in plasma impedance are a relatively less significant. Thus, it is possible to drive a plasma with an RF power supply without an intervening dynamic matching network if the range of plasma impedance variations is a small fraction of the total impedance seen by the source. Overwhelming the plasma inductance with a sufficiently high power driver results in compromising efficiency to some extent. As a result, a matching network is required when the dynamic plasma impedance is a significant fraction of the total impedance seen by the RF power source.

U.S. Pat. Nos. 6,150,628, 6,388,226, 6,486,431, and 6,552,296 disclose constant current switching mode RF power supply containing an inductive element in series with the plasma load. The plasma is primarily driven as the secondary of a iron- or ferrite-core transformer, the primary of which is driven by the RF power supply. In such a configuration, a dynamic impedance matching network is disclosed to be not required. The current through the plasma is maintained at about the value of the initial inductor current to adjust the power based on the size of the load.

The above patents also disclose various methods for igniting a plasma that include high voltage pulses, ultraviolet light and capacitative coupling, which also serve to restrict variations in plasma impedance by sidestepping the large impedance variations typically encountered upon plasma ignition.

There are other known designs that use the plasma as a secondary in a transformer-like design in which the secondary and the primary are relatively weakly coupled via a shared core. R. J. Taylor developed a plasma production technique for cleaning the inside of a toroidal vacuum chamber using a process plasma, and had built such a device in 1973. The circuit used the air-core Ohmic Heating (OH) winding of a tokamak as its transformer primary, and a matching network consisting of fixed C1 and C2. Similar designs operating on other tokamaks, some having iron-core transformers, are known. These designs typically operate in the frequency range 1–50 kHz.

In designs similar to those of R. J. Taylor, the changes in the plasma impedance do not significantly affect the loading of the driver because the parameter $$\delta \equiv \frac{M_{1p}}{\sqrt{L_1 L_p}},$$

where $M_{1p}$ is the mutual inductance between the primary inductance $L_1$ and the plasma inductance $L_p$, is quite small. Consequently, variation in the inductive load seen at the terminals of the transformer primary is smaller. In contrast, when the plasma is substantially directly driven, e.g., via current-straps, where $$\delta \equiv \frac{M_{ant-plasma}}{\sqrt{L_{ant} L_{plasma}}},$$

wherein $M_{ant-plasma}$ is the mutual inductance between the antenna inductance $L_{ant}$ and the plasma inductance $L_{plasma}$, is not small, and as a result changes in the plasma impedance represent relatively larger changes in the load impedance seen by the RF source. This variation typically requires the use of variable matching network to provide a reasonable match with a 50 Ohm impedance of the RF source for delivering power.

When plasma is driven directly, i.e., without a core for substantially coupling a plasma secondary to a primary winding connected to the RF source, changes in plasma impedance are significant at the leads of the antenna or at the primary winding of a coupling transformer. This configuration has been coupled to a plasma or plasma/antenna combination via a dynamic matching network that may be continually adjusted in response to the changing plasma impedance.

The problems faced in an efficient plasma generator design include the need for a low maintenance and easily configured antenna, the elimination of expensive dynamic matching networks for directly coupling the RF power source to the non-linear dynamic impedance presented by a plasma, and the need for RF power sources that can be efficiently modulated and are frequency agile.

SUMMARY OF THE INVENTION

An improved design for efficiently coupling one or more RF sources to a plasma is disclosed. Also disclosed are method and system for generating a plasma with the aid of an RF power source without requiring the use of a dynamic matching network to couple the RF power source to the plasma. In this context a dynamic matching network requires impedance adjustments in response to the dynamic impedance presented by a plasma.

Instead of dynamic impedance matching network, a reactive network couples the RF power source to the antenna-plasma combination. The reactive network is selected so that at least a first plasma impedance value, a substantially resistive load is presented to the RF power source. Further at a second plasma impedance value, preferably, selected so as to significantly cover the expected dynamic plasma reactance range, the reactance seen by the RF power source is about the same as that of the RF power source itself. Thus, disclosed herein are a method of designing a reactive circuit to eliminate the need for a dynamic matching circuit between a plasma and a RF power source. Also disclosed is a reactive circuit suitable for a plasma generator operating at about 13.56 MHz. The described method is also applicable for designing reactive circuits for many frequencies other than 13.56 MHz.

In addition to the plasma impedance, other considerations may also be taken into account in the design of the reactive circuit. For instance, it may be designed so as to present a phase difference at the switched power supply, the RF power source, since this improves the efficiency of the power supply by reducing resistive losses at the switches. Such additional conditions may, in general require the values of three or more reactance elements to be determined for providing the desired behavior.

An illustrative plasma generator system comprises at least one plasma source, the at least one plasma source having an antenna including a plurality of loops, each loop having a loop axis, the plurality of loops arranged about a common axis such that each loop axis is substantially orthogonal to the common axis; at least one radio frequency power source for driving the plurality of loops substantially in quadrature and coupled to a plasma load driven in a circularly polarized mode, preferably a helicon mode, via the antenna; a static magnetic field substantially along the common axis; and a reactive network coupling the switching amplifier to the antenna loops.

The radio frequency power source preferably comprises at least one member from the group consisting of a substantially Class A amplifier, a substantially Class AB amplifier, a substantially Class B amplifier, a substantially Class C amplifier, a substantially Class D amplifier, a substantially Class E amplifier, and a substantially Class F amplifier. In one embodiment, these are connected to the primary of a transformer to reduce the drive impedance to a low value. Even more preferably the radio frequency power source includes a Class D amplifier in a push-pull configuration with a relatively low output impedance.

The radio frequency power source preferably exhibits a low output impedance. Often the low output impedance is significantly less than the standard impedance of 50 Ohm. The output impedance is preferably within a range selected from the set consisting of less than about 0.5 Ohms, less than about 2 Ohms, less than about 3 Ohms, less than about 5 Ohms, less than about 8 Ohms, less than about 10 Ohms, and less than about 20 Ohms. Preferably the output impedance is less than 5 Ohms, even more preferably the output impedance is between 0.5 to 2 Ohms, and most preferably the output impedance is less than 1 Ohm. In a preferred embodiment, the output impedance is about 12 Ohms. Use of this low-impedance driver together with the disclosed circuit for connecting the driver to the current strap of an antenna eliminate the need for a match box, thus reducing circuit complexity and eliminating a source of failure and higher costs in plasma processing systems.

A further advantage of the disclosed system is that the voltage applied to the antenna can be made quite large prior to plasma formation, thus increasing the ability to initiate the plasma in a variety of working conditions. Once the plasma is formed, the voltage reduces to a lower level to sustain the plasma.

Depending upon the phasing between antenna elements and the value of $B_o$, the system can be run as a helicon source, or as a magnetized inductively coupled plasma (MICP) source, or as an ICP source at $B_o=0$. Furthermore, it is observed to operate efficiently and robustly in pressure regimes (e.g., with $P_o$ approximately 100 mTorr) that are very difficult to access and/or make good use of using prior art plasma sources. The currents in the antenna elements appear to abruptly "lock" into a quadrature excitation mode when the conditions on neutral pressure $P_o$, input power $P_{RF}$, and externally applied axial magnetic field $B_o$, are right. When this occurs, advantageously the plasma appears to fill the chamber approximately uniformly, thus providing the ability to produce uniform processing conditions.

Additionally, the combination of antenna system plus RF generator can create and maintain a plasma under conditions where the plasma parameters vary over much larger ranges than have been reported for other sources (e.g. neutral pressure $P_o$ varied from 100 mTorr down to 5 mTorr, and then back up again to 100+ mTorr, in a cycle lasting approximately one minute), without the need for the adjustment of any dynamic matching network components.

Another advantage of the disclosed system is that the elimination of the dynamic matching network allows an "instant-on" type of operation for the plasma source. This characteristic can be used to provide an additional control for the process being used. In particular, it is possible to modulate the amplitude of the RF power generating the plasma, between two (or more) levels such as 30% and 100%, or in a fully on-off manner (0% to 100%). This modulation can occur rapidly, e.g. at a frequency of several kilohertz, and can accomplish several purposes. For instance, the average RF power can be reduced with a consequent reduction in average plasma density. The "instant-on" operation can generate plasma with an average RF input power of as little as 5 W in a volume of 50 liters.

In addition, modulation can be used to control the spatial distribution of the working gas within the reaction chamber: The plasma modifies the distribution of the working gas, thus, contributing to the non-uniformity of fluxes of the active chemicals or radicals. By modulating the duty cycle of plasma production, the flow characteristics of the neutral gas during the plasma off time (or reduced-power-level time) can be adjusted to control the uniformity of the process. Since the plasma initiation time is usually within 10–20 microseconds of the application of the RF, the duty cycle may be controlled at frequencies as high as tens or hundreds of kHz.

These and other features of the invention are described next with the help of the following illustrative figures.

BRIEF DESCRIPTION OF THE FIGURES

The following illustrative figures are provided to better explain the various embodiments of the invention without intending for the figures to limit the scope of the claims.

DETAILED DESCRIPTION OF THE INVENTION

Figure 1:
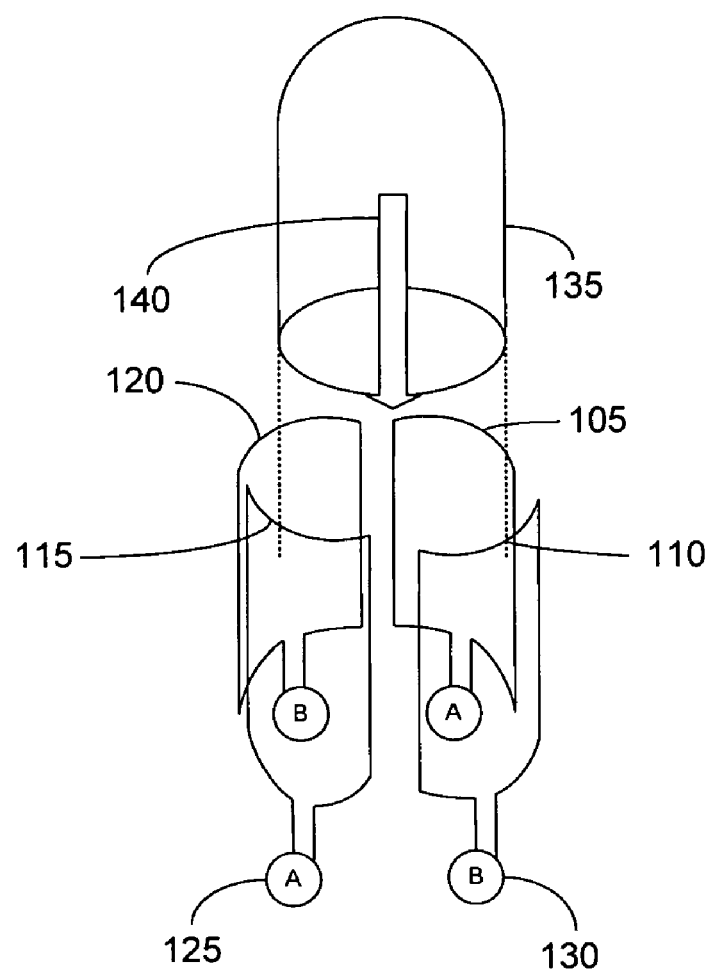
FIG. 1 illustrates a plasma source chamber with two sets of antenna elements.

Turning to the figures, FIG. 1 illustrates a plasma source chamber with two sets of antenna elements. The antenna design includes two orthogonal single- or multi-turn loop elements 105, 110, 115, and 120, arranged about a common axis. The antenna elements 105, 110, 115, and 120 are each driven by RF power sources, A 125 or B 130 as shown. Each antenna loop may be coupled to the same RF power source with a phase splitter, or to distinct RF power sources, to drive the antenna elements in quadrature. Preferably the loops in the antenna are constructed from eight (8) gauge teflon coated wire although bare copper wire or other conductors may also be used.

FIG. 1 shows two orthogonal sets of two-element Helmholtz-coil-like loop antennas, with loop elements 105 and 115 in one set and loop elements 110 and 120 in the second set. The loop elements are wrapped azimuthally around an insulating cylinder 135 such that the magnetic fields that are produced when a current is passed through them are approximately transverse to the axis of the cylinder. The opposing elements of each set are connected in series, in a Helmholtz configuration. The wires interconnecting opposing loop elements are preferably arranged such that adjacent segments carry currents flowing in opposite directions in order to enhance cancellation of stray fields associated with them, although this is not necessary to the device operation. The antennas are energized such that the currents in both orthogonal branches are nearly equal and phased 90 degrees apart to produce an approximation to a rotating transverse magnetic field.

In the example case of a helicon mode plasma, a static axial $B_o$-field 140 is produced, for instance, by a simple electromagnet. This field runs along the axis of the cylinder. The direction of this static field is such that the rotating transverse field mimics that of the m=+1 helicon wave. In practice, the amplitude and direction of the current producing the external field may be adjusted to modulate the performance of the plasma generator. The overall amplitude of the necessary field is typically in the range 10–100 Gauss for the parameters discussed here, but for different size sources alternative ranges may be employed. Once the static field optimum amplitude and direction are chosen, they typically need no further adjustment.

In combination, the static field and the RF field of the antenna elements produce the m=+1 helicon mode in the plasma inside the insulating cylinder, which sustains the plasma discharge. It should be noted that it is also possible to vary, and thus de-tune the static magnetic field, or to not apply the field at all, so that the helicon mode is not directly excited. This operation produces a plasma as well, but typically not as efficiently as the helicon mode. Of course, the static field may then be applied to improve the operation of the plasma source/generator.

It should also be noted that it is possible to achieve the same overall conditions of FIG. 1 using for instance multi-turn loop antennas instead of single loop, and/or a squat bell jar. Although not a requirement, it is preferable for the Bell jar to fit within the antenna frame with no more than a ½" gap.

One example plasma source setup is as follows: A quartz bell jar has approximately 12" inside diameter (such as a standard K. J. Lesker 12×12), consisting of a straight-cylindrical section approximately 15 cm tall with a 6" radius hemispherical top. The jar rests atop a vacuum chamber approximately 12" i.d.×8" tall (not part of the plasma source). The antennas consist of two sets of opposing, close-packed, approximately rectangular, two-turn continuous loop antenna elements that surround the bell jar, with approximately ⅛" to ½" spacing between the antennas and the bell jar at every point. The turns within each element are connected in series, and the two elements within each set are also connected in series, such that their fields are additive. The self-inductance of each set is approximately 10 microHenries in this example, and the mutual inductance between the two sets is less than 1 microHenry. Vertical and horizontal antenna loop sections approximately 25 cm and 20 cm long, respectively, consist of 8-guage Teflon-coated wire. In alternative embodiments single turns of rigid copper conductors may be employed in place of one or two turns of Teflon-coated wire. The particular embodiments described herein for producing a transverse rotating field should not be interpreted to limit the scope of the claimed invention in the absence of express indications.

Figure 2:
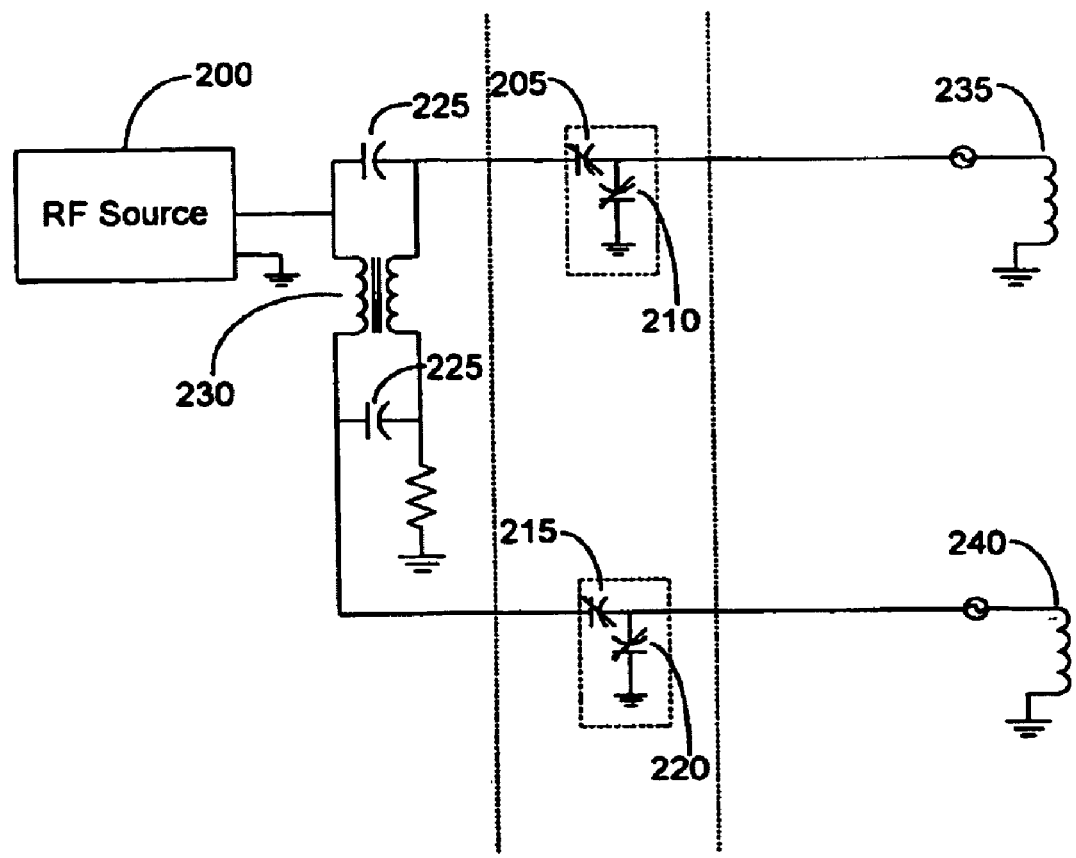
FIG. 2 illustrates a tunable circuit with an RF power source coupled to an antenna.
Figure 3:
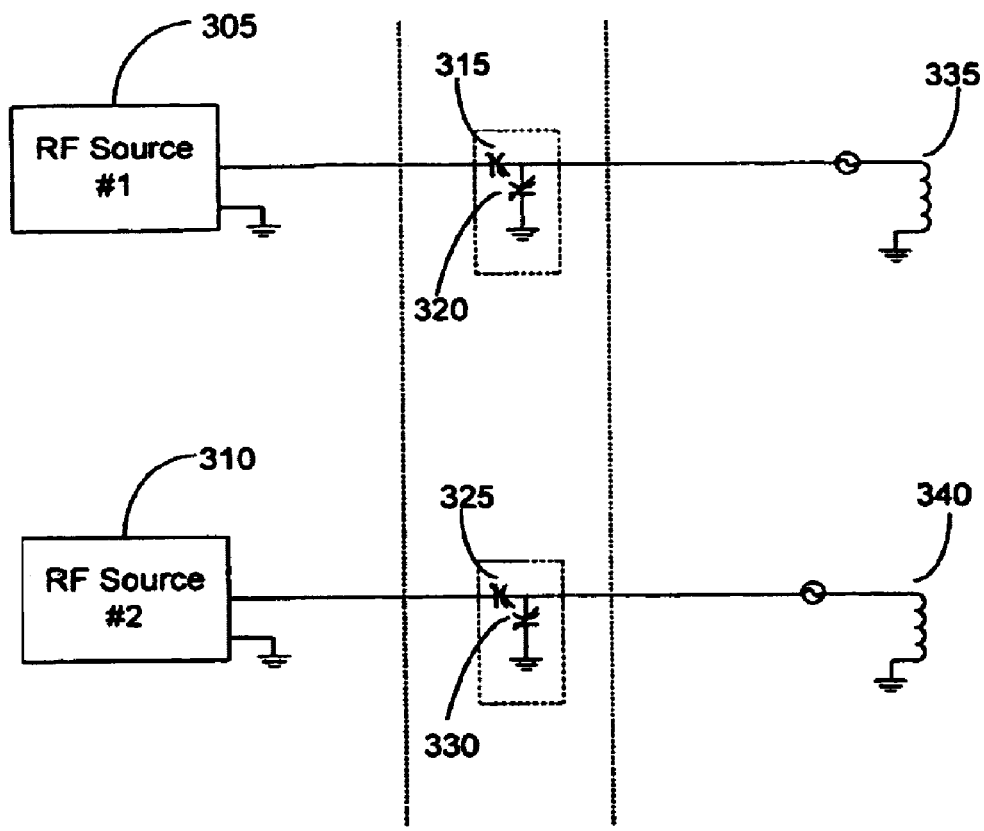
FIG. 3 illustrates a second tunable circuit with an RF power source coupled to an antenna.
Figure 4:
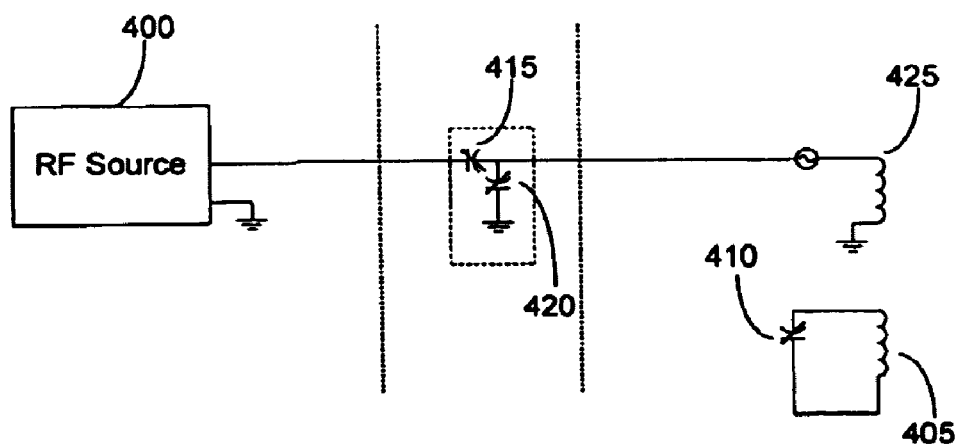
FIG. 4 illustrates a third tunable circuit with an RF power source coupled to an antenna.

A conventional RF power source and dynamic matching scheme, see FIGS. 2 to 4, may be used to excite the antenna currents in the antenna described above. Moreover, the circuits of FIGS. 2 to 4 are compatible with many of the disclosed methods. Some of these methods include steps such as providing a low output impedance to an RF power source; and adjusting a reactance coupling the RF power source to the antenna such that the resonance frequency in the absence of a plasma is the desired RF frequency. A low output impedance can be understood by reference to the quality factor ("Q") for the circuit with and without the plasma. The "Q" with no plasma present should be five to ten-fold or even higher than in the presence of the plasma. Notably, unlike known circuits, such a combination of the RF power source and antenna will not need to be readjusted in the presence of plasma by changing the reactance in response to changes in the plasma impedance.

In FIG. 2 the RF source 200 may be a commercial 2 MHz, 0–1 kW generator, connected to the quadrature/hybrid circuit at port "A" 125 illustrated in FIG. 1 via 50 ohm coax. The "+45 degree" and "−45 degree" legs of the quadrature/hybrid circuit are connected to individual L-type capacitative matching networks composed of adjustable capacitors 205, 210, 215, and 220 as shown. The reactance of capacitors 225 is about 100 ohms each at the operating frequency, and the reactance of either side of the transformer 230 is about 100 ohms with the other side open. As shown in FIG. 2, a single RF source 200 may be used, together with a passive power splitter (the quadrature/hybrid circuit) and four adjustable tuning elements 205, 210, 215, and 220 to match to the two separate antenna inductances 235 and 240.

Another embodiment, illustrated in FIG. 3, employs two separate RF power sources 305 and 310, and thus entirely separates the two antenna power circuits connected to inductances 335 and 340 via tunable capacitors 315, 320, 325, and 330 respectively. Such an arrangement is advantageous in that each RF source can be operated at full power, thus doubling the amount of input power as compared to that of a single RF source, and the phasing and amplitude ratio may be adjusted between the antennas. Typically, sources 305 and 310 are operated at roughly the same amplitude and at 90 degrees out of phase, although the amplitude and/or phase difference might be varied in order to change the nature of the excited mode. For example, by operating them at different amplitudes, an elliptically polarized plasma helicon mode rather than a strictly circularly polarized mode could be sustained.

A third embodiment, illustrated in FIG. 4, places a passive resonant circuit, comprising inductor/antenna inductance 405 and adjustable capacitor 410 on one leg, and drives the other leg with an RF source 400 with a dynamic matching circuit having tunable capacitors 415 and 420 connected to antenna inductance 425. This arrangement tends to excite the same sort of elliptical helicon mode in the plasma, with the passive side operating approximately 90 degrees out of phase with the driven side, thus providing many advantages but with only a single RF source and dynamic matching network.

The working gas in this example setup is Argon, with pressure ranging from 10 mTorr to over 100 mTorr. A static axial field is manually settable to 0–150 G and is produced by a coil situated outside the bell jar/antenna assembly, with a radius of about 9".

Plasma operation at a pressure of approximately 75 mTorr exhibits at least three distinct modes. First, a bright mode in which the plasma is concentrated near the edge of the bell jar is observed for $B_o<B_{critical}$ when $P_{RF}$ is less than or approximately 200W. Here, $B_o$ is the axial magnetic field while $B_{critical}$ is a critical value for the axial field for exciting a plasma using a helicon mode. Similarly, power levels $P_{RF}$ and $P_{threshold}$ denote the RF power supplied to the antenna and a threshold power described below. In this mode, the RF antenna currents tend to not be in quadrature, instead being as much as 180 degrees out of phase. Second, a dull-glow-discharge-like mode, with uniform density/glow at higher power but with approximately 1–2 cm thick dark space along the wall of the bell jar at lower powers, is observed for $B_o>B_{critical}$ but $P_{RF}<P_{threshold}$. In this case the RF currents are in robust quadrature, appearing to abruptly lock at approximately 90 degrees phase shift shortly after the plasma is formed. Third, at higher $P_{RF}>P_{threshold}$ and with $B_o>B_{critical}$, a bright plasma is formed that appears to be more evenly radially distributed than that of mode (1), and the antenna currents again tend to lock into quadrature phasing. The third regime represents an efficient mode of operation, and can be achieved at a neutral gas pressure that has proven to be very difficult to access for known plasma sources, although each of these regimes may have application in plasma processing.

In an aspect, the conventional RF power source and tunable matching network described in FIGS. 2 to 4 may be eliminated in favor of a streamlined power circuit.

Figure 5:
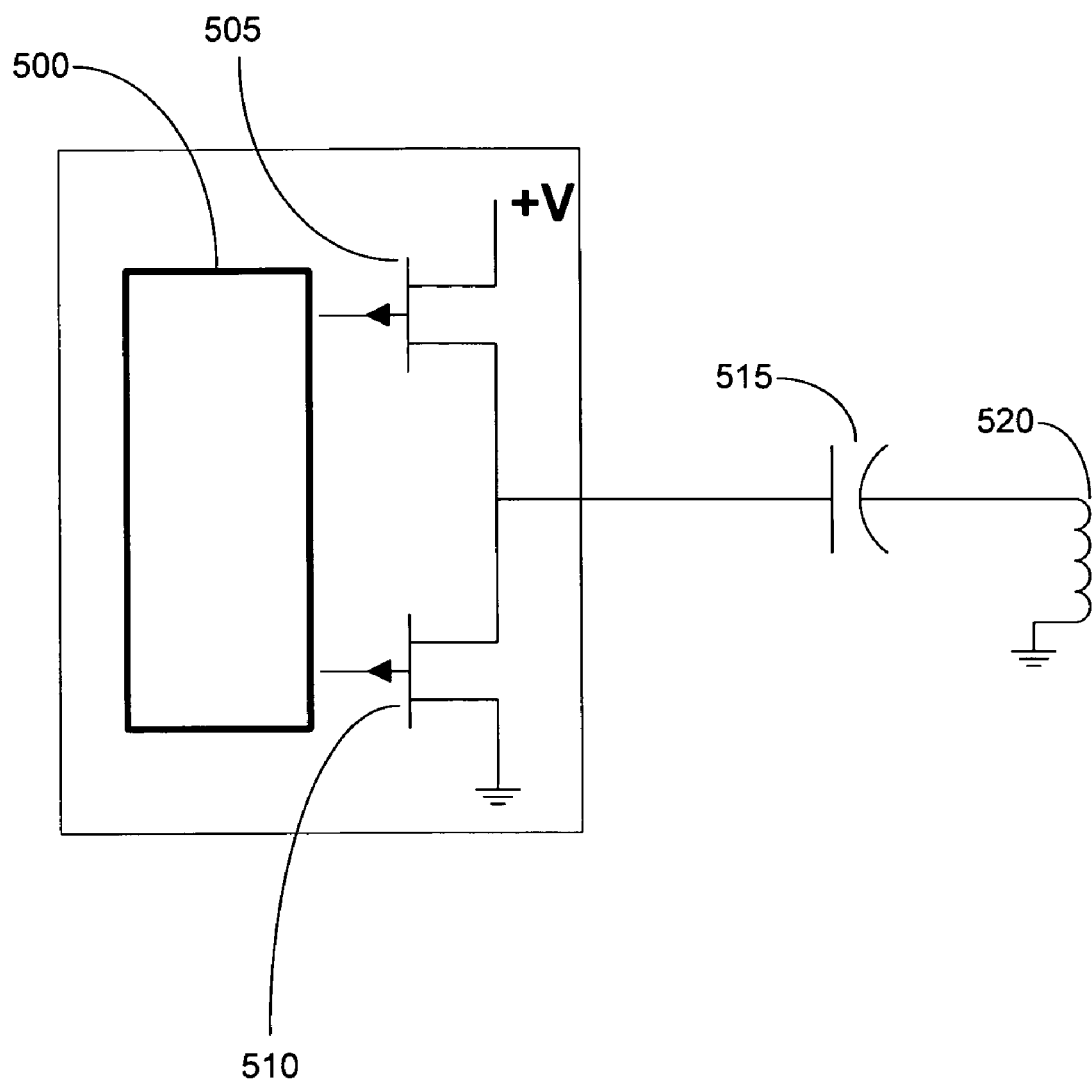
FIG. 5 illustrates a circuit with an RF power amplifier coupled to an antenna current strap.

In a preferred embodiment, an RF power circuit drives the antenna current strap directly, using an arrangement such as that shown in FIG. 5. The RF amplifier illustrated in FIG. 5 is preferably one of the many types of RF amplifiers having a low output impedance (i.e. a push-pull output stage) that are known in the field. Transistors 505 and 510 are driven in a push-pull arrangement by appropriate circuitry 500, as is known to one of ordinary skill in the art. In this arrangement typically one transistor is conducting at any time, typically with a duty cycle of or less than 50%. The output of the the transistors is combined to generate the complete signal.

Preferably, the power semiconductors, e.g., transistors 505 and 510, in the output stage are operated in switching mode. In the FIGS. 5–7 these are depicted as FETs, but they can also be, for example, bipolar transistors, IGBTs, vacuum tubes, or any other suitable amplifying device. An example of switching mode operations is provided by Class D amplifier operation. In this mode alternate output devices are rapidly switched on and off on opposite half-cycles of the RF waveform. Ideally since the output devices are either completely ON with zero voltage drop, or completely OFF with no current flow there should be no power dissipation. Consequently class D operation is ideally capable of 100% efficiency. However, this estimate assumes zero ON-impedance switches with infinitely fast switching times. Actual implementations typically exhibit efficiencies approaching 90%.

Preferably, the RF driver is coupled directly to the antenna current strap 520 through a fixed or variable reactance 515, preferably a capacitor. This coupling reactance value is preferably such that the resonant frequency of the circuit with the coupling reactance and the antenna, with no plasma present, is approximately equal to the RF operating frequency.

An alternative arrangement of the output stage of this circuit, illustrated in FIG. 6(A), includes a transformer 620 following or incorporated into the push-pull stage, with driver 600 and transistors 605 and 610, to provide electrical isolation. Transformer 620 may optionally be configured to transform the output impedance of the push-pull stage, if too high, to a low impedance. Capacitor 615 is arranged to be in resonance at the desired drive frequency with the inductive circuit formed by transformer 620 and antenna current strap 625. A similar embodiment is shown in FIG. 6(B), where capacitor 615 is used for DC elimination, and capacitor 630 is resonant in the series circuit formed by leakage inductance of transformer 620 and inductance of the current strap 625.

Figure 6:
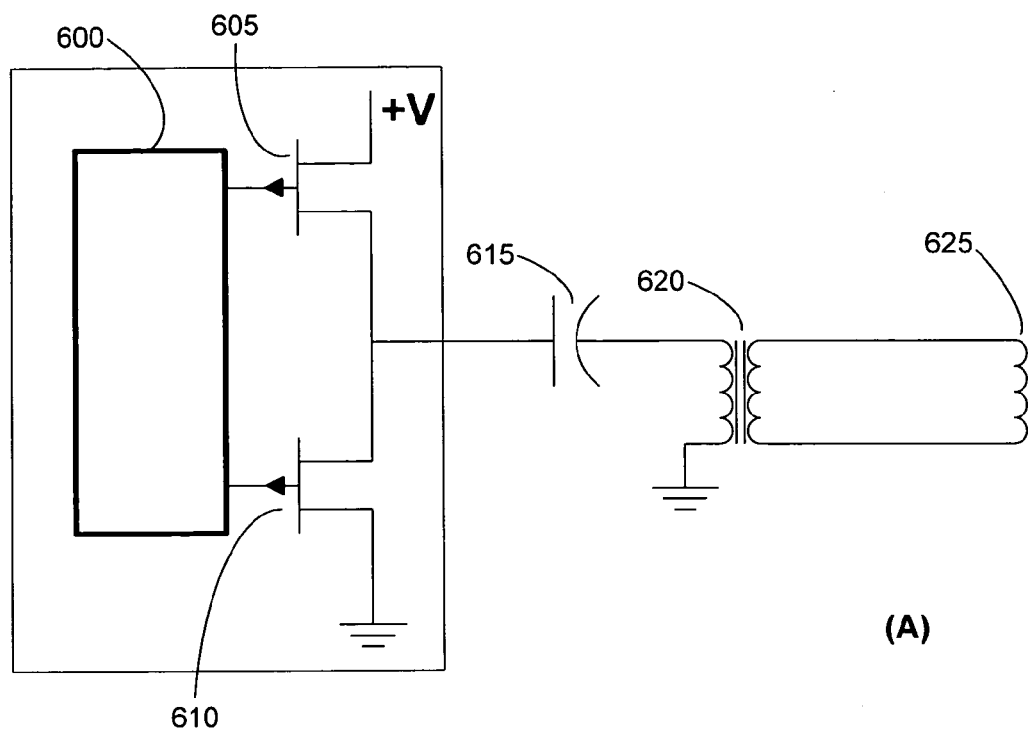
FIG. 6 illustrates a second circuit with an RF power amplifier coupled to an antenna current strap.
Figure 6:
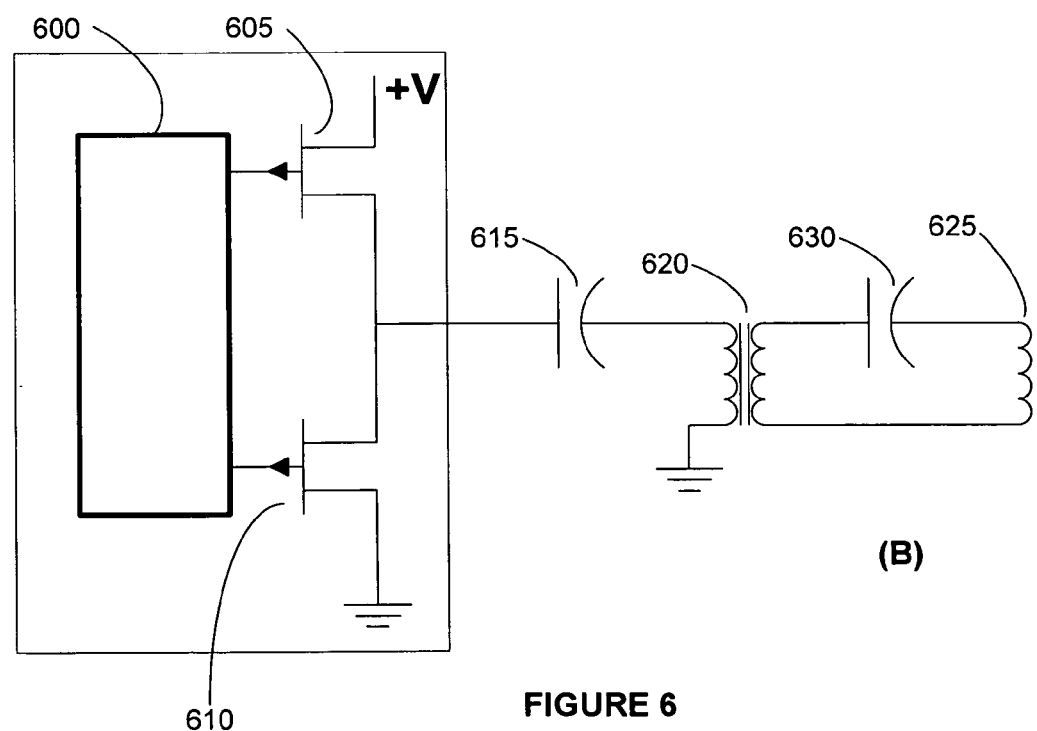
Figure 7:
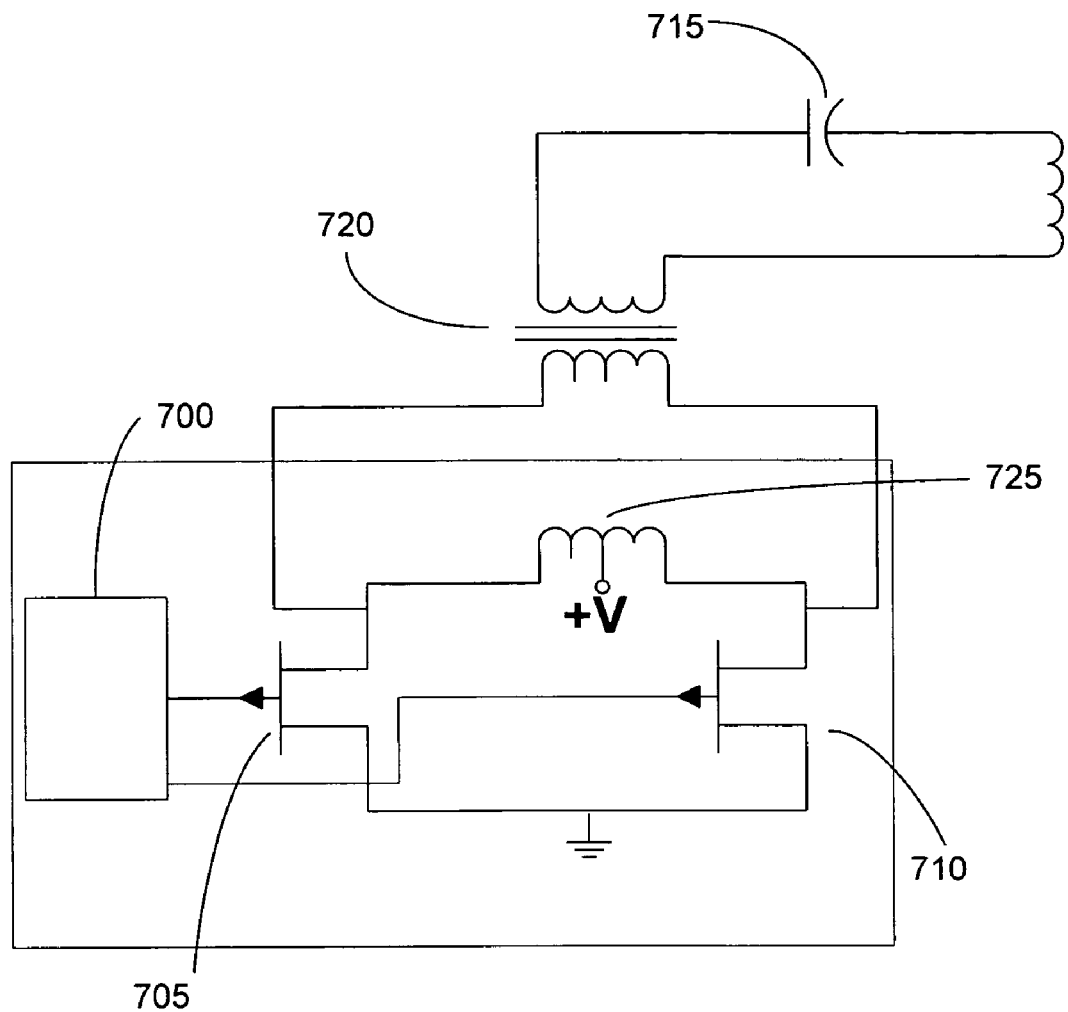
FIG. 7 illustrates a third circuit with an RF power amplifier coupled to an antenna current strap.

FIG. 7 illustrates yet another RF power and antenna current strap configuration. A center-tapped inductor 725 incorporated in the DC power feed is connected to the output stage having push-pull driver 700 and transistors 705 and 710. Isolation is provided by transformer 720. Again, only one or the other transistor is conducting at any time, typically with a duty cycle of less than 50%. The circuits of FIGS. 5–7 are provided as illustrative examples only. Any well-known push-pull stage or other configurations providing a low output impedance may be used in their place.

The RF power source may also be used with any helicon antenna, such as either a symmetric (Nagoya Type III or variation thereof, e.g., Boswell-type paddle-shaped antenna) or asymmetric (e.g., right-hand helical, twisted-Nagoya-III antenna) antenna configuration, or any other non-helicon inductively coupled configuration.

The RF power source may be amplitude modulated with a variable duty cycle to provide times of reduced or zero plasma density interspersed with times of higher plasma density. This modulation of the plasma density can be used to affect the flow dynamics and uniformity of the working gas, and consequently the uniformity of the process. A more spatially uniform distribution comprising plasma may therefore be generated by a plasma generator system by a suitable choice of a modulation scheme.

In general, a plasma generator system may use radio frequency power sources based on operation as a substantially Class A amplifier, a substantially Class AB amplifier, a substantially Class B amplifier, a substantially Class C amplifier, a substantially Class D amplifier, a substantially Class E amplifier, or a substantially Class F amplifier or any sub-combination thereof. Such power sources in further combination with the antennas for exciting helicon mode are suitable for generating high density plasmas. Moreover, for non-switching amplifiers, such as those shown in FIGS. 2–4, an intermediate stage to transform the RF source impedance to a low output impedance may be employed to approximate the efficient operation of the switching amplifier based embodiments described herein.

Figure 8:
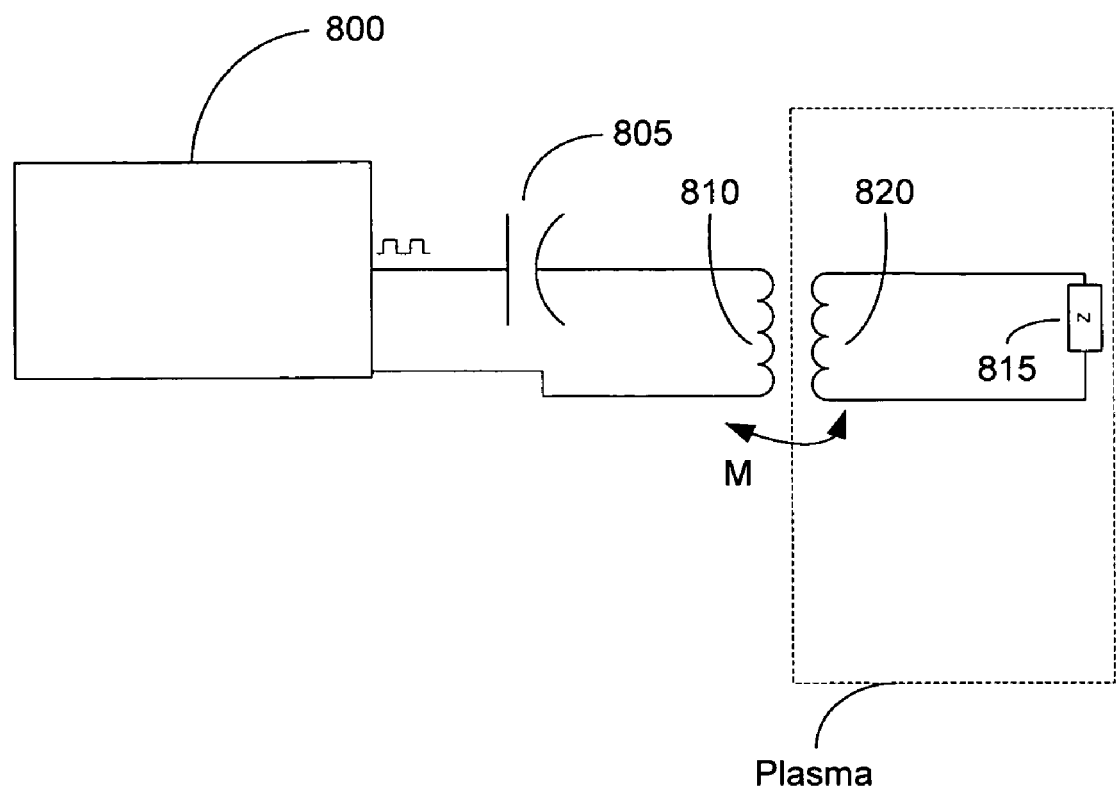
FIG. 8 illustrates a simplified model of the RF power amplifier, antenna current strap, and plasma.

In inductively coupled plasma sources, the antenna current strap is located in proximity to the region where plasma is formed, usually outside of an insulating vessel. From a circuit point of view, the antenna element forms the primary of a non-ideal transformer, with the plasma being the secondary. An equivalent circuit is shown in FIG. 8, in which inductor 810 represents a lumped-element representation of the current strap and any inductance in the wiring, including any inductance added by e.g., the driver's output transformer present in some embodiments. Components in the box labeled P represent the plasma: inductor 820 is the plasma self inductance, and impedance 815 represents the plasma dissipation, modeled as an effective resistance. M represents the mutual inductance between the antenna and plasma. Transistor driver 800 is represented as a square-wave voltage source. The capacitance 805 is adjusted at the time the system is installed to make the resonant frequency of the circuit approximately match the desired operating frequency. In an alternate embodiment with a fixed capacitor, the RF frequency may be adjusted to achieve the same effect.

Figure 9:
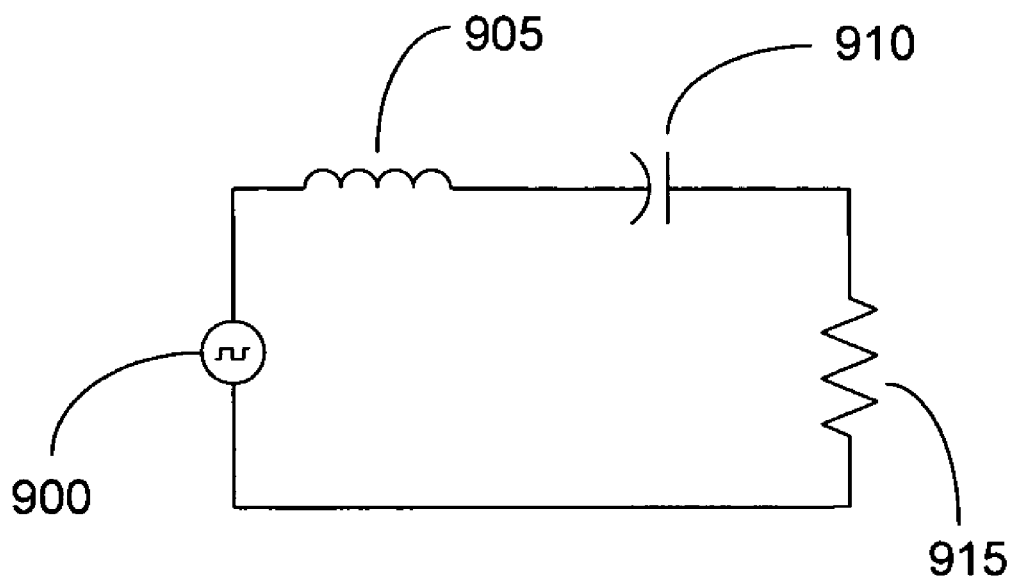
FIG. 9 illustrates a lumped circuit equivalent of the model depicted in FIG. 8.

For illustrating the operation of the system, the overall system may be modeled as shown in FIG. 9. In FIG. 9 all inductors have been lumped into inductance 905, all capacitors into capacitance 910, and all dissipating elements into resistor 915, and the amplifier should ideally operate as an RF voltage source (i.e., having zero output impedance).

Figure 10:
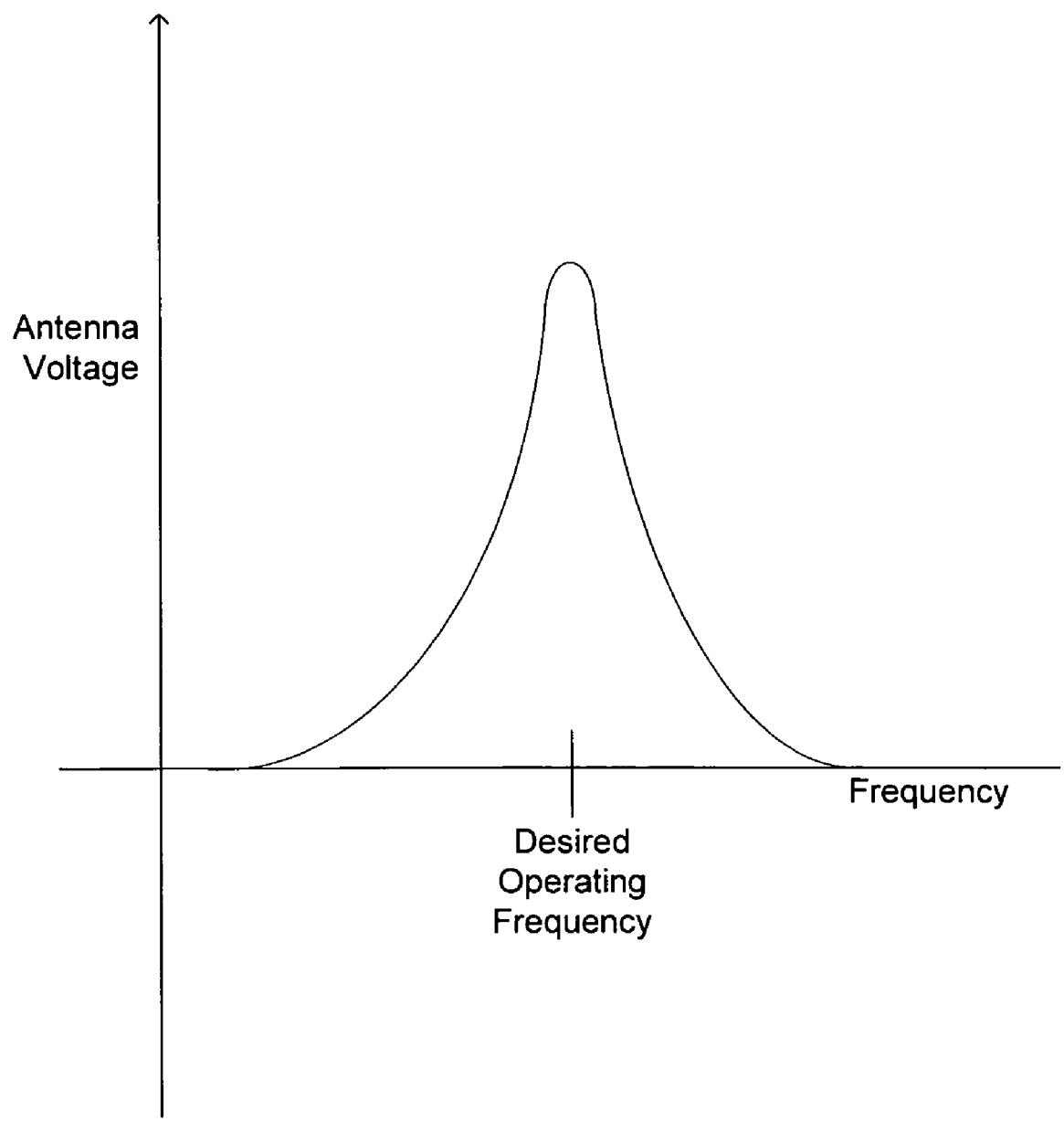
FIG. 10 illustrates the frequency response of a plasma source without a plasma.
Figure 11:
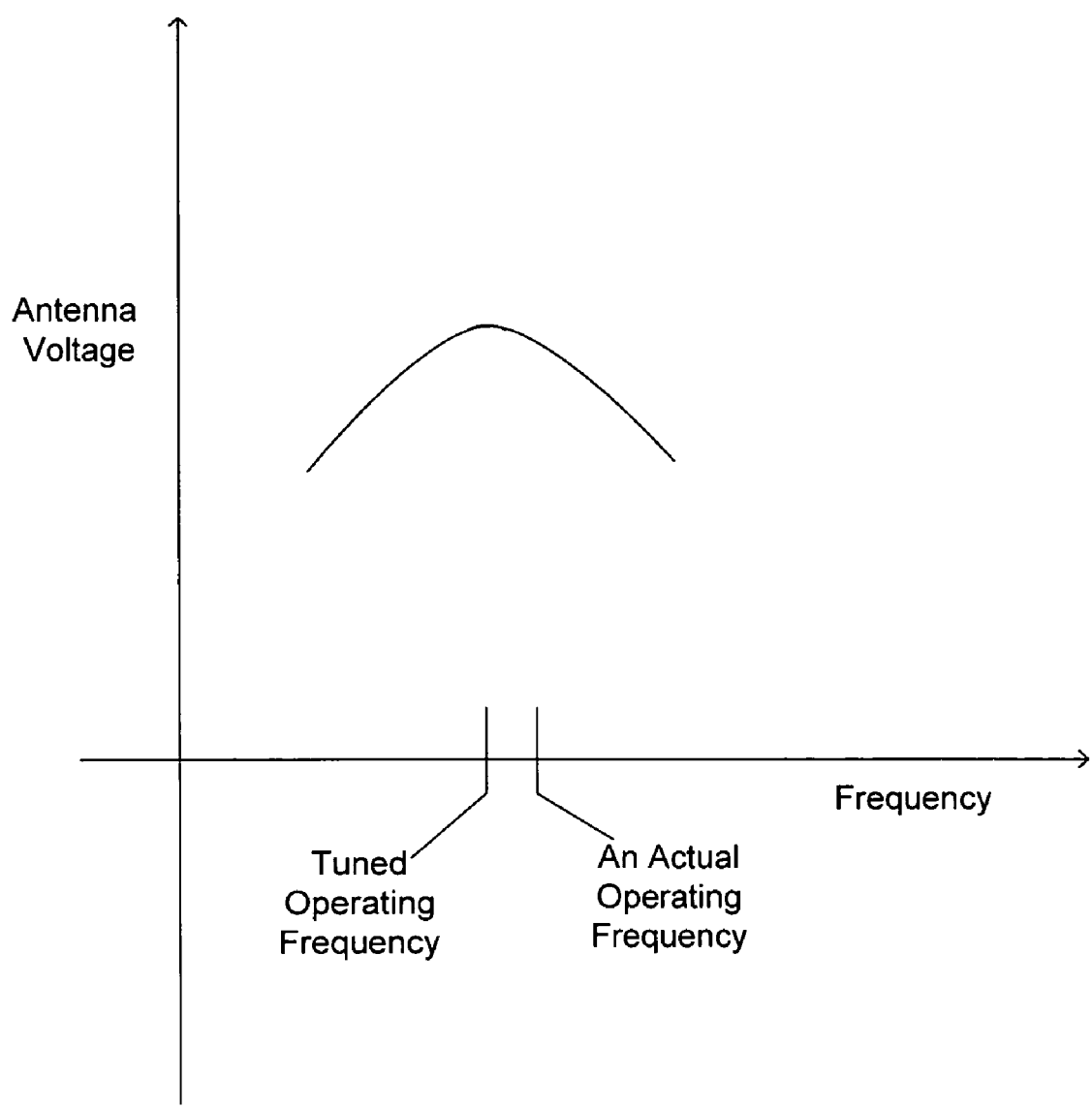
FIG. 11 illustrates the frequency response of a plasma source with a plasma present.

With no plasma present, R is small since there is little dissipation, and the circuit of FIG. 9 exhibits a narrow resonant response to changes in frequency, as shown in FIG. 10. This provides one of the advantages of the circuit's operation: it is possible to drive the voltage on the antenna to a high value with relatively little power input, thus facilitating the initial breakdown of the gas in the reaction chamber. Once the plasma forms, the damping in the system considerably broadens the resonant peak, as shown in FIG. 11, reducing the Q of the overall circuit. Although the center frequency of the resonance may shift with plasma conditions, that shift is negligible compared to the width of the resonant response when the plasma load is present. Therefore, when operating with a plasma load the circuit is relatively insensitive to variations in operating conditions, and requires no retuning. This is illustrated in FIG. 11, where the overall system resonance has shifted its frequency slightly, although the Q is sufficiently reduced that the operation of the system remains efficient. With the reduced Q of the circuit, the voltage applied to the plasma self-adjusts to be considerably reduced over the no-plasma case. In some embodiments, it may be somewhat advantageous to actually detune the operating frequency of the RF drive slightly from the exact no-plasma resonance to one side or the other, depending on the shift of the resonant frequency when the plasma forms.

Figure 12:
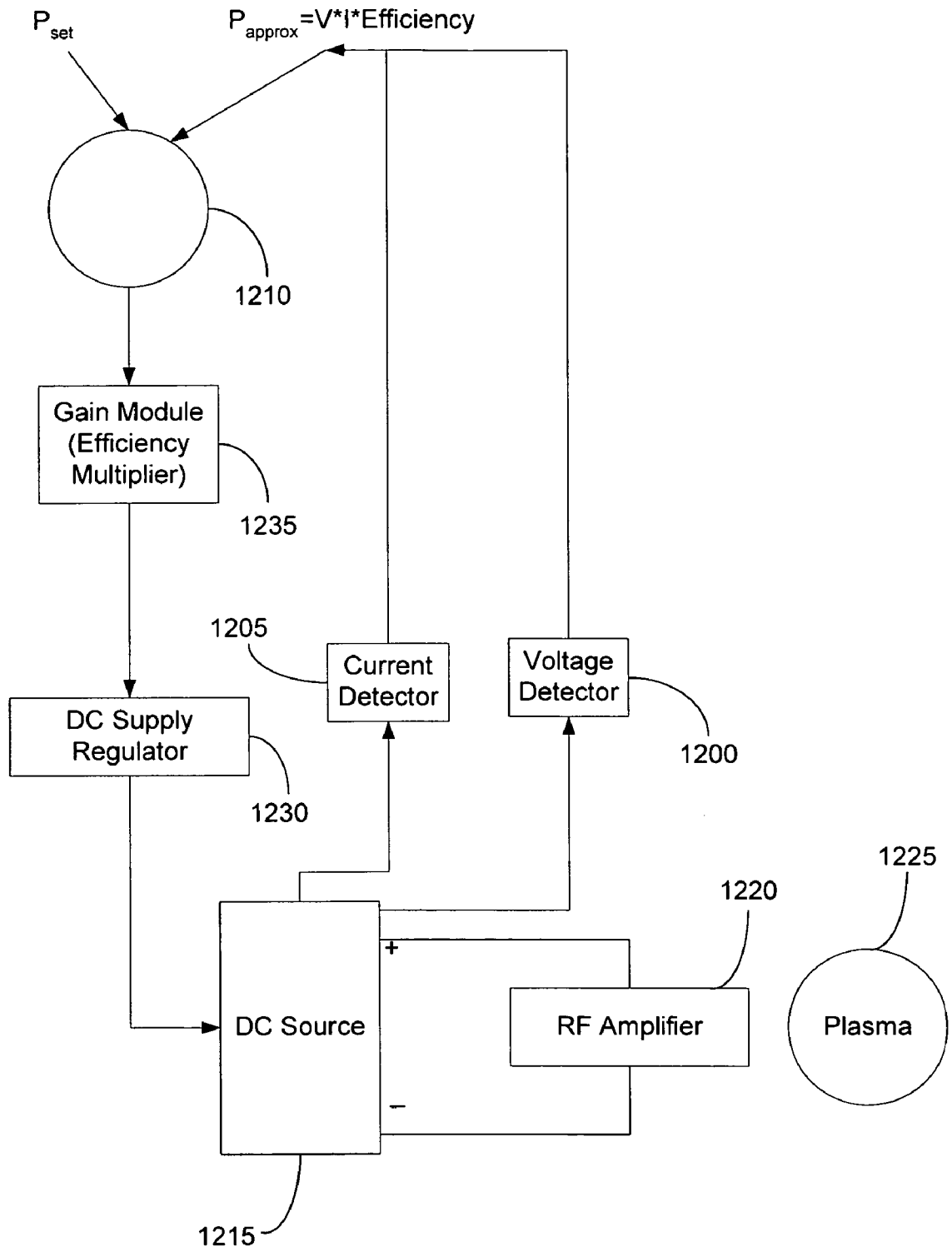
FIG. 12 illustrates a feedback arrangement for controlling a plasma source.

The level of power input to the plasma may be controlled by a variety of techniques, such as adjusting the DC supply level on the RF output stage. In one embodiment, the supply voltage may be in response to sensed variations in plasma loading to maintain a relatively constant power into the plasma source. As illustrated in FIG. 12, the sensing of plasma loading for adjustments by DC supply regulator 1230 may be achieved, for example, by monitoring the voltage from the DC supply 1215 by voltage sensor 1200 and the DC current into the RF/Plasma system by current sensor 1205, and using their product together with a previously measured approximation to the amplifier efficiency in module 1210 to estimate the net power into the plasma 1225 from RF Amplifier 1220. Efficiency multiplier for gain module 1235 can be measured for different output levels, for instance by monitoring heat loads at various points of the system, and stored digitally, so that variations in efficiency with output level are accounted for. Alternatively, the RF voltage and current can be measured, and their in-phase product evaluated to estimate the real power being dissipated in the plasma.

The sensing of plasma may also extend to sensing spatial uniformity by either direct sensing or indirect sensing by way of variations in the voltage or current. Changing the duty cycle in response to such variations can then control the spatial distribution of plasma. In addition, modulating the duty cycle can further allow control over the average input power to improve the efficiency of plasma generation. The feedback arrangement of FIG. 12 can also allow switching between two or more power levels as described previously.

"Low" impedance, as used herein, means that the series resonant circuit shown in FIG. 9 has a "Q" that should be five to ten-fold or even higher with no plasma present than with plasma present. That is, the amplifier output impedance should be sufficiently small that the energy dissipated in a half-cycle of output is much less than that stored in the reactive components. This condition is mathematically defined as $$Z_{out} \ll \sqrt{\frac{L}{C}},$$

where L and C are the lumped values shown in FIG. 9. The RF amplifier will approach operation as a voltage source when this condition holds.

A low resistance, e.g., for the output impedance of the RF source, generally refers to a resistance of less than about 10 ohm, preferably less than about 6 Ohms, more preferably less than about 4 Ohms, and most preferably less than about 1 Ohm.

However, not all embodiments of the invention require that the elements in the reactive circuit coupling the RF power source to the antenna/plasma be selected based on the resonant frequency of the circuit without a plasma being present. Indeed several, alternative conditions are possible that allow a suitable specification of the reactive circuit such that there is no need for a dynamic matching circuit while efficient coupling is possible with the dynamic impedance of a plasma.

While presenting a variable impedance, it is possible to describe the plasma reactance as being expected to be confined between a high and a low limit. Thus, a high expected plasma reactance component and a low expected plasma reactance may be specified. For instance, such a specification may reflect a one-a distance away from the expected mean value. Many other similar specifications are possible to indicate the likelihood of the plasma impedance actually falling outside the specified limits. Indeed, instead of a high expected plasma reactance, it is possible to specify a value that is not symmetrically placed relative to the low expected plasma reactance. Moreover, while a particular plasma impedance may fail to conform to a normal distribution, a collection of several plasmas is likely to collectively present a normal distribution for the combined impedance.

Similarly, a collection of several RF power sources connected together is likely to exhibit a normal distribution, both with respect to frequency and time. Then a suitable choice of a reactance network may actually ensure that the variation in plasma reactance is well matched to the variation in the RF power sources by matching them at two values of the expected plasma reactance.

With such a specification of the plasma reactance and a knowledge or estimate of the lowest or likely low plasma resistance, a value at which the variation of the plasma impedance is likely to be the greatest, it is possible to arrive at a method of specifying the components in the reactive circuit.

Figure 13:
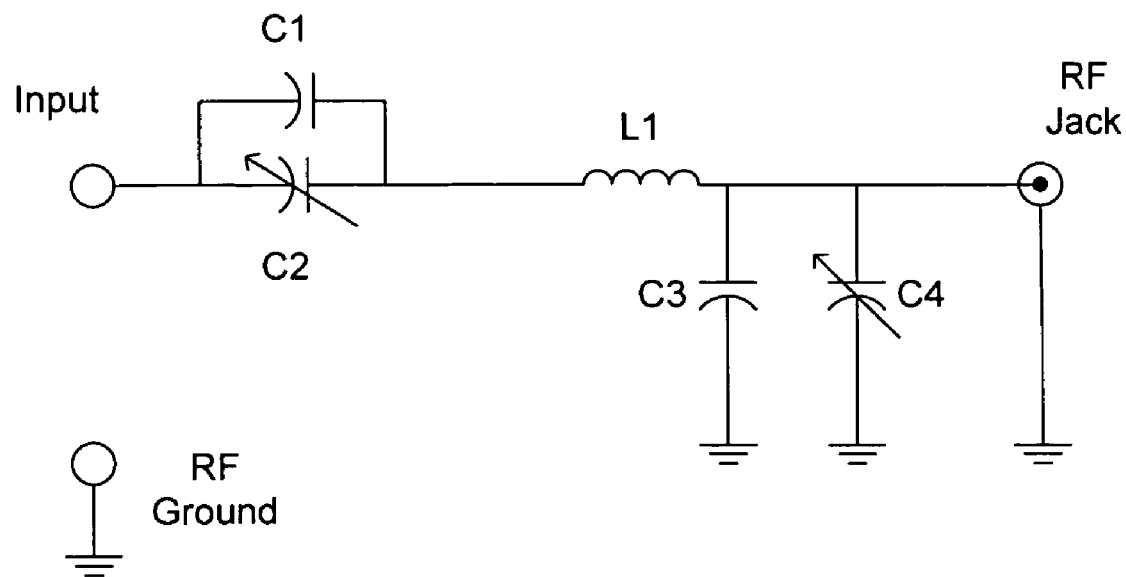
FIG. 13 illustrates a reactive network for coupling an RF power source to a plasma.

For example, in the illustrative circuit of FIG. 13, from the publication "3 kW and 5 kW Half-bridge Class-D RF Generators at 13.56 MHz with 89% Efficiency and and Limited Frequency Agility", Directed Energy Inc. © 2002, document number 9300-0008 Rev. 1," retrieved on Jun. 10, 2004 from the web address http://www.ixysrf.com/pdf/switch_mode/appnotes/3ap_3_5kw13_56mhz_gen.pdf, which is incorporated herein by reference, with the specification that the impedance at the RF jack is 50 Ohms, $C_a = C_1 + C_2$, and $C_b = C_3 + C_4$, the series impedance is $$Z_1 = \frac{1}{sC_a} + sL_1 = \frac{1+s^2 L_1 C_a}{sC_a},$$

and shunt impedance $$Z_2 = \frac{\frac{Z_L}{sC_b}}{Z_L + \frac{1}{sC_b}} = \frac{Z_L}{1 + sZ_L C_b}.$$

The impedance seen at the input is $Z_1 + Z_2$. With L1 given as 2.1 µH, this complex value may be adjusted with suitable components to be 14+i12.6 Ohms by adjusting $C_a$ to be about 81.6 pF and $C_b$ at about 376 pF.

In a capacitively coupled system, e.g. for use at 13.56 MHz to provide an RF bias for a substrate in a semiconductor processing chamber, an illustrative plasma antenna combination may, for example, present a resistance $R_p$ of about 1 to 4 Ohms and a reactance $X_p$ of about −8 to −25 Ohms. Thus, hooking the circuit of FIG. 13 to such an antenna/plasma combination is difficult in general. With the large imaginary component of the impedance that it sees, the transistor switching circuit will safely operate with a supply voltage that is a fraction of the desired peak supply voltage of about 700 to 800 V, e.g., at about 250 V (more likely 200). The peak output voltage is given by $V_{supply}/2 \times |H|$, where $|H|$ is the magnitude of the transfer function of the system, and in the 250 V case will range from about 28 to 83 V for the various plasma conditions.

when operating at a given frequency, a total impedance may be adjusted by adding an inductor (having a positive reactance) or a capacitor (having a negative reactance) in series with the impedance. As an example, if there is a stray inductance L due e.g. to leads and the like, the total impedance may be adjusted to a level at or near zero for a given operating frequency by adding a capacitor in series, with the capacitance adjusted so that $$Z_{tot} = Z_L + Z_C = i\omega L - \frac{1}{i\omega C} \approx 0.$$

Similarly, in driver circuits using output devices with significant output capacitance, such as transistors or mosfets, dissipation due to the output capacitance (e.g. $C_{oss}$ on some specification sheets) may be reduced by providing a slightly inductive load. This is because of the charge stored in the capacitance: a properly tuned inductive load discharges the capacitance without having to dissipate this charge.

Figure 14:
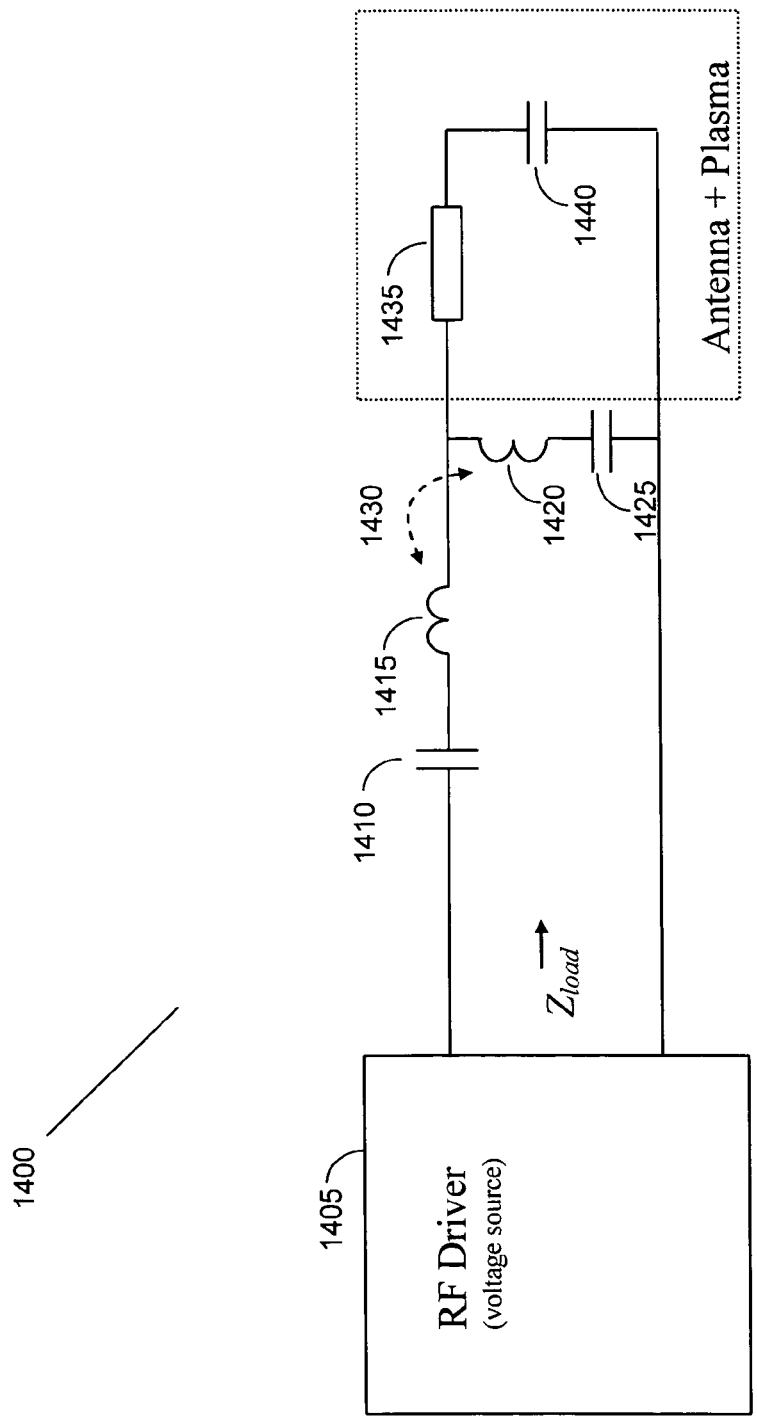
FIG. 14 shows an illustrative embodiment of the invention with elements selected in a reactive network to eliminate the need for a dynamic matching network.

FIG. 14 shows an illustrative general reactive circuit 1400 suitable for coupling radiofrequency power source 1405 to a capacitively driven plasma or an antenna-plasma combination. Although, this circuit relates to a capacitively coupled driver, e.g., for the RF biasing of a substrate in a semiconductor processing plasma, but the principle for determining the values of the components applies to an inductively coupled system as well. The illustrative general reactive circuit 1400 may be tuned either using the capacitors or inductors or both. For instance, the reactance of capacitors 1410 and 1425 may be chosen to be approximately the same as the minimum plasma reactive component, at about 500 pF each. Inductors 1415 and 1420 are then tuned to satisfy two conditions: a) at the largest magnitude of plasma reactance, i.e., a high expected plasma reactance limit, the imaginary part of the overall load seen by the transistor output stage is small, and b) at the smallest magnitude of plasma reactance, i.e., a low expected plasma reactance limit, the imaginary part of the load seen by the output stage is adjusted to optimize operation of the radio frequency power source, e.g., +12 Ohms as in the circuit described in the above Directed Energy reference.

The impedance seen by a transistor driver stage is given by $Z_{load}=Z_{1410}+Z_{1415}+(Z_{1420}+Z_{1425})\|Z_p$. Here $Z_{1410}$ represents the impedance of inductor 1410 in FIG. 14 and the like while $Z_p$ represents one value of expected plasma reactance. That is, the driver sees capacitor 1410 in series with inductor 1415 and in series with the parallel combination of plasma impedance 1440 and capacitor 1425+inductor 1420 series combination.

For a radio frequency power source, which operates best when it drives load with a with an output reactance of +12 Ohms, case "a" corresponds to $Im(Z_{load})$ of about 0 Ohms at a plasma reactance, $X_p$, of about −25 Ohms. Case "b," then corresponds to $Im(Z_{load})$ being about 12 Ohms at Xp of about −8 Ohms. These conditions result in a pair of equations that may be solved with $R_p$ set at a low value, say about 1 Ohm, since this level of plasma resistance results in large variations in the load seen by the RF driver. These two equations can be solved for the unknown value of inductances 1415 and 1420. Under the described conditions, in this exemplary embodiment, values of inductance 1420 is about 345 nH and inductance 1415 is about 185 nH resulting in $Im(Z_{load})$ of about 0 Ohms for condition "a" and $Im(Z_{load})$ of about 11.9 Ohms for condition "b"' respectively. More sophisticated calculations preferably take into account stray inductances, coil inductances and the like along with other non-ideal effects.

Alternative choices may be elected for the value for capacitors 1410 and 1425, e.g., by electing smaller values to improve the tolerance if subtracting two comparable numbers is resulting in large errors. Additionally, instead of fixing the values for capacitors 1410 and 1425, and adjusting the values for inductors 1415 and 1420, it is also possible to fix the value for inductors 1415 and 1420 and adjust the value of capacitors 1410 and 1425. It will be recognized further that the total impedance is the important quantity for any series or parallel combination of reactive components, and that specific values of L and C or specific geometries can be used in the above circuit. As an example, a series combination of an inductor L and a capacitor C can have a reactance of about 5.9 ohms when L=345 nH and C=500 pF, or when L=620.5 nH and C=250 pF. These values can be adjusted to satisfy other constraints in the system, such as the need to have a high (or low) impedance at a $2^{nd}$ harmonic.

Alternative output transistor stages may be operated at different impedances in the reactive load, including a slightly capacitive load. Then, the condition $Im(Z_{load})$ is about 0 Ohms may be specified at some midpoint value rather than for the low or high expected plasma reactance limit. Thus, at this specified magnitude of plasma reactance, i.e., a specified plasma reactance limit, the imaginary part of the overall load seen by the transistor output stage is small. Further, the specified plasma reactance may be a value outside the range of expected operation. However, such a specification may result in higher output current. In addition, adding a resistive path in parallel with capacitor 1425 improves the performance of the reactive circuit. Thus, the reactive circuit may include resistive elements as well.

In another aspect, nonlinear resistive or reactive elements may be used for the purpose of reducing the impedance variation seen by the RF power source. In yet another aspect, the inductors 1415 and 1420 may be arranged to have a small amount of mutual inductance, which can be either positive or negative. A positive mutual inductance $M_{1415, 1420}$, e.g., in the range $$\frac{M_{1415,1420}}{\sqrt{L_{1415}L_{1420}}} < 0.02,$$

may be used to reduce the sensitivity of the response transfer function H to changes in plasma reactance, while negative mutual inductance may increase the sensitivity.

These methods for tuning or setting up of a reactive network provide several advantages in addition to removing the need for a dynamically tuned matching circuit. For example, since the tuning at one plasma reactance in the range of reactance values expected for a plasma matches that for the operation of amplifier, it provides the transistors with the reactive impedance needed for efficiently operating at a high voltage. Further, although at the other end of the plasma range, the reactance seen by the output stage is small, the total load is also small, enabling operation at high current and low supply voltage resulting in the reactance presented to the transistors being less important. Moreover, this specification ensures that over a broad range of plasma reactance, a reasonable amount of power may be delivered from the RF source to the plasma. In another aspect, with this design enables use of a large number of output stages that may be combined, for instance, in parallel.

Often the specification for a RF power supply is an output voltage for application to the antenna terminals, with the RF input voltage level being adjusted to produce this desired output voltage according to what is necessary for varying plasma operating conditions. Examination of the transfer function $H=V_{plasma}/V_{in}$ reveals that the system "voltage transfer function," or the ratio of output voltage to input voltage, $H=V_{plasma}/V_{in}=[(Z_{1410}+Z_{1415})\|Z_p]/Z_{load}$.

For the tuning as described, this transfer function has a resonant character, in that the magnitude of H is greater than one over a substantial, if not the entire, range of operation. |H| varies from approximately 75 at $X_p$ of about −25 Ohms (case "a" above, with $R_p$ of about 1 Ohm) down to approximately 1.5 at $X_p$=−8 Ohms (case "b" above, with $R_p$ still at about 1 Ohm). For the higher plasma resistance, for instance, $R_p$ of about 4 Ohms, |H| varies from approximately 21 to 1.6. Therefore, selecting a reactance network well suited for operation at the lowest expected plasma resistance ensures with high degree of certainty that the variation in plasma impedance would be smaller at a higher values of the plasma resistance.

It should be noted that although some of the discussion is in terms of the resonant frequencies for the reactive network, it is often desirable to drive the radio frequency power source at a frequency that deviates somewhat from the resonant frequency in the absence of a plasma in the direction of the frequency spread due to the presence of the plasma. This ensures stable and efficient operation over frequencies of interest.

The disclosed system and methods provide an advantage in being able to break down this gas and initiate the plasma by virtue of the fact that the high Q of the circuit with no plasma allows high voltages to be induced on the antenna element with relatively low power requirements. This no-plasma voltage can be controlled to give a programmed breakdown of the working gas; once the plasma forms, induced currents in the plasma serve to load the system and lower the high voltages for inducing the breakdown, and thus, avoid stressing the system.

The described circuit arrangements do not require a variable tuning element, such as a mechanically adjustable capacitor, since only fixed capacitance C is necessary. However, the various circuits can also be constructed using a variable capacitor that is adjusted, for example, for matching of the system resonance to the desired operating frequency, in a preferred embodiment, and is not needed for real-time impedance matching with the plasma operating point. Such matching is useful to counter the effects of mechanical vibration or aging that may cause the L-C resonant frequency to drift.

In one embodiment, the operating frequency is adjusted to compensate for small deviations from resonance, while mechanically tuning the capacitor compensates for large deviations. In an alternative embodiment, adjustments are made by tuning the capacitor. In the preferred (tuned) embodiment, this tuning is automated and takes place during periods when the source is off-line. In another aspect, with tuning as part of the process control, for instance to provide small tweaks to the process conditions, the disclosed arrangement reduces the number of adjustable elements to as few as one in embodiments with adjustable tuning elements.

As one skilled in the art will appreciate, the disclosed invention is susceptible to many variations and alternative implementations without departing from its teachings or spirit. Such modifications are intended to be within the scope of the claims appended below. For instance, one may provide impedance matching for a low impedance with a transformer in combination with a conventional amplifier. Also, although the invention obviates the need for dynamic matching circuits, the use of some dynamic matching circuit in combination with the reactive circuits disclosed herein to reduce the otherwise stringent requirements placed on dynamic matching networks is intended to be included within the scope of the invention as indicated. Therefore, the claims must be read to cover such modifications and variations and their equivalents. Moreover, all references cited herein are incorporated by reference in their entirety for their disclosure and teachings.

The invention claimed is:

1. A method for reducing the need for a dynamic matching circuit for directly driving a dynamic plasma impedance, the method comprising the steps of:
   providing a radio frequency power source with a low output impedance;
   providing a reactive network comprising a first and second reactance between the radio frequency power source and the plasma, wherein the first reactance and the second reactance are selected such that at a first plasma reactance, a substantially resistive load is presented to the RE power source, and at a second plasma reactance a specified reactance seen by the RF power source; and
   controlling an average input power.

2. The method of claim 1, wherein values of the first plasma reactance and second plasma reactance span a substantial fraction of an expected range the dynamic plasma reactance.

3. The method of claim 1, wherein the first and second plasma reactance values correspond to a high expected plasma reactance limit and a low expected plasma reactance limit respectively.

4. The method of claim 1, wherein the reactive network is effective when the plasma resistance is low.

5. The method of claim 1, wherein the plasma resistance is a member of the set consisting of about 1 to 5 Ohms, and less than 1 Ohm and less than 10 Ohms.

6. The method of claim 1 further comprising:
   estimating the low expected plasma reactance limit and the high expected plasma reactance limit; and
   estimating a low plasma resistance at which the reactance network is required to be effective.

7. The method of claim 1, wherein the specified reactance seen by the RF power source is about twelve Ohms.

8. The method of claim 1, wherein the step of modulating the duty cycle of the radio frequency power source further provides for neutral gas flow.

9. The method of claim 1, wherein the average input power is applied at an average density that is greater than about 1 watt per 10 liters of volume.

10. The method of claim 1, wherein at least one frequency for modulating the duty cycle is selected from the set consisting of at least about 1 Hz, at least about 10 Hz, at least about 100 Hz, at least about 500 Hz, at least about 1000 Hz, at least about 5000 Hz, at least about 10,000 Hz and at least about 100,000 Hz.

11. The method of claim 1, wherein the average input power is controlled by one or more of pulse-width-modulation, or varying the DC power supply within the RF power source.

12. The method of claim 1 further comprising the step of sensing a spatial distribution of the plasma, and in response thereto modulating the duty cycle.

13. The method of claim 12 further comprising the step of sensing a spatial distribution of the plasma, and in response thereto modulating a duty cycle to provide times of neutral gas flow, thereby modulating the spatial distribution of reactive elements comprising the plasma or neutral gas.

14. The method of claim 1, wherein varying the average input power allows selection between several output power levels.

15. The method of claim 14, wherein at least one output power level is selected from the set consisting of about 5 watts, about 10 watts, about 5 to 10 watts, about 10 to 50 watts, and about 5 watts to about 25 kW.

16. The method of claim 15, wherein a plasma power is rapidly switched between two or more levels.

17. The method of claim 16, wherein a plasma power is switched from about 30 percent to about 100 percent of full power.

18. A plasma generator system comprising:
   a radio frequency power means for providing radio frequency power; and
   at least one reactive circuit for interfacing the radio frequency power means to a plasma, the plasma exhibiting a continually changing impedance;
   wherein, at a low expected plasma resistance limit, the at least one reactive circuit presents a small total reactance when a plasma reactance is at a high expected plasma reactance limit and presents a reactance that does not exceed a specified reactance.

19. The system of claim 18, wherein the specified limit is similar to the reactance of the radio frequency power means.

20. The system of claim 18, wherein the specified limit is within a range selected from the set consisting of less than about 0.5 Ohms, less than about 2 Ohms, less than about 3 Ohms, less than about 5 Ohms, less than about 8 Ohms, less than about 10 Ohms, less than about 20 Ohms, and about twelve Ohms.

21. The system of claim 18, wherein the plasma generator produces capacitatively coupled mode ("E-mode") plasma.

22. The system of claim 18 further comprising an antenna connecting the reactive circuit to the plasma having at least one loop of a current strap located in proximity to a plasma source chamber.

23. The system of claim 22, wherein the current strap is the main coupler of power into the plasma.

24. The system of claim 18, wherein the reactive circuit further comprises a transformer, whereby providing DC isolation between the power source and the antenna.

25. The system of claim 24, wherein the radio frequency power means comprises at least one member from the set consisting of a substantially Class A amplifier, a substantially Class AB amplifier, a substantially Class B amplifier, a substantially Class C amplifier, a substantially Class D amplifier, a substantially Class E amplifier, and a substantially Class F amplifier.

26. The system of claim 25, wherein the radio frequency power means comprises a push-pull circuit.

27. The system of claim 26, wherein the push-pull circuit comprises at least one transistor that is operated in accordance with one of substantially Class D, Class E and Class F modes.

28. A method for powering a plasma, the plasma presenting a dynamic plasma impedance, by a radio frequency power source, comprising the steps of:

coupling the radio frequency power source to at least one antenna via at least one reactive circuit;

wherein the at least one reactive circuit presents a small total reactance when the plasma reactance is at a first plasma reactance and presents a reactance that does not exceed a specified limit at a second plasma reactance.

29. The method of claim 28, wherein values of the first plasma reactance and second plasma reactance span a substantially fraction of an expected dynamic plasma reactance range.

30. The method of claim 28, wherein the first plasma reactance and second plasma reactance correspond to a high expected plasma reactance limit and a low expected plasma reactance limit respectively.

31. The method of claim 28, wherein the first plasma reactance corresponds to an average expected plasma reactance.

32. The method of claim 28, wherein the first plasma reactance and second plasma reactance correspond to a high expected plasma reactance limit and a low expected plasma reactance limit respectively.

33. The method of claim 28, wherein the first plasma reactance corresponds to an average expected plasma reactance.

* * * * *